(12) United States Patent
Andarawis

(10) Patent No.: US 7,994,800 B2
(45) Date of Patent: Aug. 9, 2011

(54) SYSTEMS AND METHODS FOR ONLINE PHASE CALIBRATION

(75) Inventor: Emad Andarawis Andarawis, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 631 days.

(21) Appl. No.: 12/054,548

(22) Filed: Mar. 25, 2008

(65) Prior Publication Data

US 2009/0243628 A1    Oct. 1, 2009

(51) Int. Cl.
*G01R 35/00* (2006.01)
*G01R 27/28* (2006.01)

(52) U.S. Cl. ........................... 324/601; 324/615

(58) Field of Classification Search ............... 324/601; 72/106
See application file for complete search history.

(56) References Cited

U.S. PATENT DOCUMENTS

| | | | |
|---|---|---|---|
| 4,700,129 A | | 10/1987 | Yoshizawa et al. |
| 4,808,912 A | * | 2/1989 | Potter et al. .................. 324/601 |
| 5,070,302 A | | 12/1991 | Marcus et al. |
| 5,166,626 A | | 11/1992 | Hester et al. |
| 5,592,113 A | * | 1/1997 | Quiet et al. .................. 327/158 |
| 7,180,305 B2 | | 2/2007 | Andarawis et al. |
| 7,215,129 B1 | | 5/2007 | Andarawis et al. |
| 7,245,788 B2 | * | 7/2007 | Fujita et al. ...................... 385/3 |
| 7,332,915 B2 | | 2/2008 | Andarawis et al. |
| 7,333,913 B2 | | 2/2008 | Andarawis et al. |
| 2006/0132147 A1 | | 6/2006 | Balasubramaniam et al. |
| 2006/0239813 A1 | | 10/2006 | Shah et al. |
| 2007/0005294 A1 | * | 1/2007 | Andarawis et al. ........... 702/155 |
| 2007/0222459 A1 | | 9/2007 | Andarawis et al. |
| 2008/0072681 A1 | | 3/2008 | Ruud et al. |

OTHER PUBLICATIONS

Emad Andarawis Andarawis et al.; "System and Method for Turbine Engine Clearance Control With Rub Detection"; U.S. Appl. No. 11/768,211, filed Jun. 26, 2007; 34 Pages.

* cited by examiner

*Primary Examiner* — Jeff Natalini
(74) *Attorney, Agent, or Firm* — Penny A. Clarke

(57) ABSTRACT

A system for online relative phase calibration is provided. The system includes at least one excitation source configured to generate multiple excitation signals. The system also includes at least two sensors coupled to respective ones of the at least one excitation source via a transmission line, wherein the two sensors are configured to receive respective ones of the excitation signals. The system further includes at least two phase detectors configured to receive at least two reflected signals from the two sensors via the transmission line, wherein each of the two phase detectors are configured to output a respective voltage representing a phase difference between respective ones of the reflected signals and respective ones of the excitation signals. The system also includes a switch coupled to the sensors and the phase detectors, the switch configured to switch the phase detectors between the sensors at a pre-determined switching interval. The system further includes a calibration module coupled to the phase detectors, wherein the calibration module is configured to receive and process the respective voltage from the at least two phase detectors to generate respective calibrated voltage signals, wherein the calibration module is further configured to and match the calibrated voltage signals of each of the phase detectors.

6 Claims, 6 Drawing Sheets

SYSTEMS AND METHODS FOR ONLINE PHASE CALIBRATION

BACKGROUND

The invention relates generally to phase calibration systems and methods and more specifically, to phase calibration in sensor systems employed for measuring clearance.

Various types of sensor systems have been used to measure the distance between two objects. One of such sensor systems includes a capacitance probe employed to measure distance between two objects. The probe is located on one of the objects and measures a capacitance with respect to the other object for estimating the clearance between the two objects. Unfortunately, existing direct measurement techniques employing a single probe for a single target object can be relatively inaccurate where the target object changes its geometry during the course of measurement. For example, in a rotating component, such as a turbine blade, the geometry and position of the blade may change depending on various conditions. Such changes may result in a drift in the calibration of the probe.

There are several techniques that are currently used for phase calibration of the sensor systems. A commonly used technique is a "factory calibration" approach. The factory calibration is utilized to measure and control variability between parts. Some of the calibration techniques include injection of a known phase reference, and calibrating the system based on a phase to voltage conversion of a phase detector. However, phase references pose a challenge in systems that require very high accuracy such as, but not limited to, 0.1 degree. Moreover, factory calibration techniques are employed prior to installation of the sensor system and are not adapted to online phase calibration.

Another commonly used technique for calibration of a phase detector in a clearance sensor system includes subjecting a sensor to a controlled clearance change, and measuring a gain of the system as a response to the clearance change. However, this technique requires exhaustive calibration steps. Furthermore, the technique does not take into account variations that occur after the system leaves the factory.

Accordingly, there is a need for an improved method of phase calibration that addresses one or more aforementioned issues.

BRIEF DESCRIPTION

In accordance with an embodiment of the invention, a system for online relative phase calibration is provided. The system includes at least one excitation source configured to generate multiple excitation signals. The system also includes at least two sensors coupled to respective ones of the at least one excitation source via a transmission line, wherein the two sensors are configured to receive respective ones of the excitation signals. The system further includes at least two phase detectors configured to receive at least two incident and two reflected signals from the two sensors via the transmission line, wherein each of the two phase detectors are configured to output a respective voltage representing a phase difference between respective ones of the reflected signals and respective ones of the excitation signals. The system also includes a switch coupled to the sensors and the phase detectors, the switch configured to swap the phase detectors between the sensors at a pre-determined switching interval, or in response to a calibration request signal. The system further includes a calibration module coupled to the phase detectors, wherein the calibration module is configured to receive and process the respective voltage from the at least two phase detectors to generate respective calibrated voltage signals, wherein the calibration module is further configured to and match the calibrated voltage signals of each of the phase detectors.

In accordance with another embodiment of the invention, a system for online absolute phase calibration is provided. The system includes an excitation source configured to generate a plurality of excitation signals at multiple frequencies. The system also includes a phase shifter coupled to the excitation source, wherein the phase shifter is configured to introduce different phase shifts in respective ones of the excitation signals to generate multiple phase shifted excitation signals. The system further includes a phase detector configured to receive the excitation signals and the respective phase shifted excitation signals and output multiple voltages representing the different phase shifts. The system also includes a processor configured to determine a phase to voltage transfer function for the phase detector based upon the voltages and the different phase shifts.

In accordance with another embodiment of the invention, a system for online absolute phase calibration is provided. The system includes an excitation source configured to generate multiple excitation signals at respective frequencies. The system also includes a sensor coupled to the excitation source via a transmission line, wherein the sensor is configured to receive the excitation signals. The system further includes a phase detector coupled to the sensor and configured to receive multiple reflected signals from the sensor corresponding to respective ones of the excitation signals and output a voltage representing a phase difference between respective ones of the reflected signals and of the excitation signals. The system also includes a processor configured to calculate the phase difference based upon each of the frequencies and a length of the transmission line; and determine a phase to voltage transfer function for the phase detector based upon the phase difference calculated and the voltage output.

In accordance with another embodiment of the invention, a method for online relative phase calibration is provided. The method includes generating a plurality of excitation signals. The method also includes transmitting respective ones of the excitation signals to at least two sensors. The method further includes reflecting the respective excitation signals from the sensors. The method also includes performing multiple phase measurements to generate multiple voltages via at least two phase detectors, wherein each of the voltages represent a phase difference between the excitation signals reflected and the excitation signals transmitted. The method further includes switching a coupling of each of the sensors between the phase detectors at a pre-determined switching interval. The method also includes matching the voltage obtained for each of the sensors at the phase detectors to calibrate the phase detectors.

In accordance with another embodiment of the invention, a method for online absolute phase calibration is provided. The method includes generating a plurality of excitation signals at respective frequencies. The method also includes transmitting the excitation signals via a transmission line. The method further includes receiving and reflecting the excitation signals via a sensor. The method also includes performing a plurality of phase measurements to generate a plurality of voltages via a phase detector, each of the voltages representing a phase difference between the excitation signal reflected and the excitation signal transmitted at a respective one of the frequencies. The method also includes calculating the phase difference based upon the frequencies and a length of the transmission line. The method further includes determining a phase to voltage transfer function for the phase detector based upon the phase difference calculated and the voltage output.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the invention include a system and method for phase calibration of phase detectors. As used herein, the term 'phase calibration' refers to calibration of phase detectors employed in applications such as, but not limited to, clearance measurement, for example clearance measurement for turbine blades. More specifically, a relative calibration technique and absolute phase calibration techniques have been disclosed. A phase-to voltage transfer function is determined in the absolute calibration techniques, while a determination of the phase-to voltage transfer function is not necessary for the relative calibration technique. The term 'phase-to-voltage transfer function' refers to a function relating voltage to a corresponding phase difference in a circuit. The phase detectors include electrical output such as, but not limited to, current and voltage.

Figure 1:
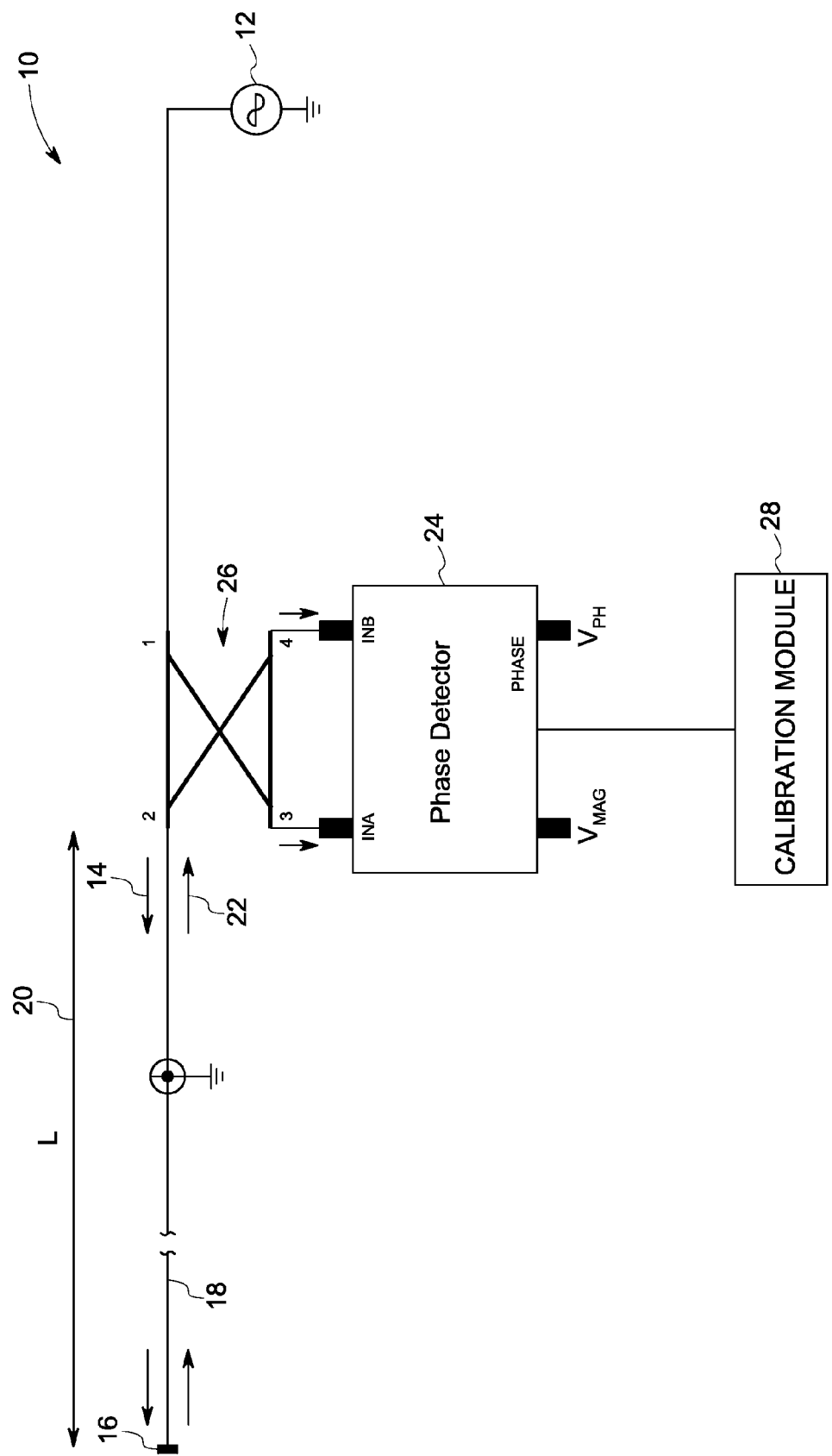
FIG. 1 is a schematic illustration of a system for online relative phase calibration including a calibration module in accordance with embodiments of the invention.

FIG. 1 is a schematic illustration of a system 10 for online relative phase calibration. The system 10 includes at least one excitation source 12 that generates excitation signals 14. The excitation source 12 includes, but is not limited to, a voltage controlled oscillator, a non-controlled oscillator, or a radio-frequency (RF) excitation source. In the illustrated embodiment, the excitation source 12 includes a voltage controlled oscillator. The excitation signals 14 are incident upon a load 16 via a transmission line 18 of a length represented by reference numeral 20. In a particular embodiment, the load 16 is a sensor such as a capacitive probe. The excitation signals 14 may also be referred to as incident signal 14. The load 16 reflects a part of the excitation signal 14 due to an impedance mismatch between an impedance of the load 16 and a characteristic impedance of the transmission line 18. Consequently, this results in generation of a reflected signal 22. The reflected signal 22 is a function of reflection coefficient that is defined as a function of mismatch between the characteristic impedance of the transmission line 18 and impedance of the load 16. The reflection coefficient is given by:

$$\frac{Z1 - Z0}{Z1 + Z0}, \qquad (1)$$

wherein Z1 is the impedance of the load 16, and Z0 is the characteristic impedance of the transmission line 18. The reflection coefficient modulates the phase of the reflected signal 22. The reflected signal 22 also incurs a phase delay due to length 20 of the transmission line 18. This results in a total phase difference that is measured during operation.

In the illustrated example, a phase detector 24 receives the reflected signal 22 after passing through a bidirectional coupler 26. The bidirectional coupler 26 enables independent sampling of the incident signal 14 and the reflected signal 22. The phase detector 24 receives the incident signal 14 and the reflected signal 22 to output a voltage representative of a phase difference between the reflected signal 22 and the incident signal 14. A calibration module 28 is coupled to the phase detector 24 to calibrate measurements obtained from at least two such loads 16.

Figure 2:
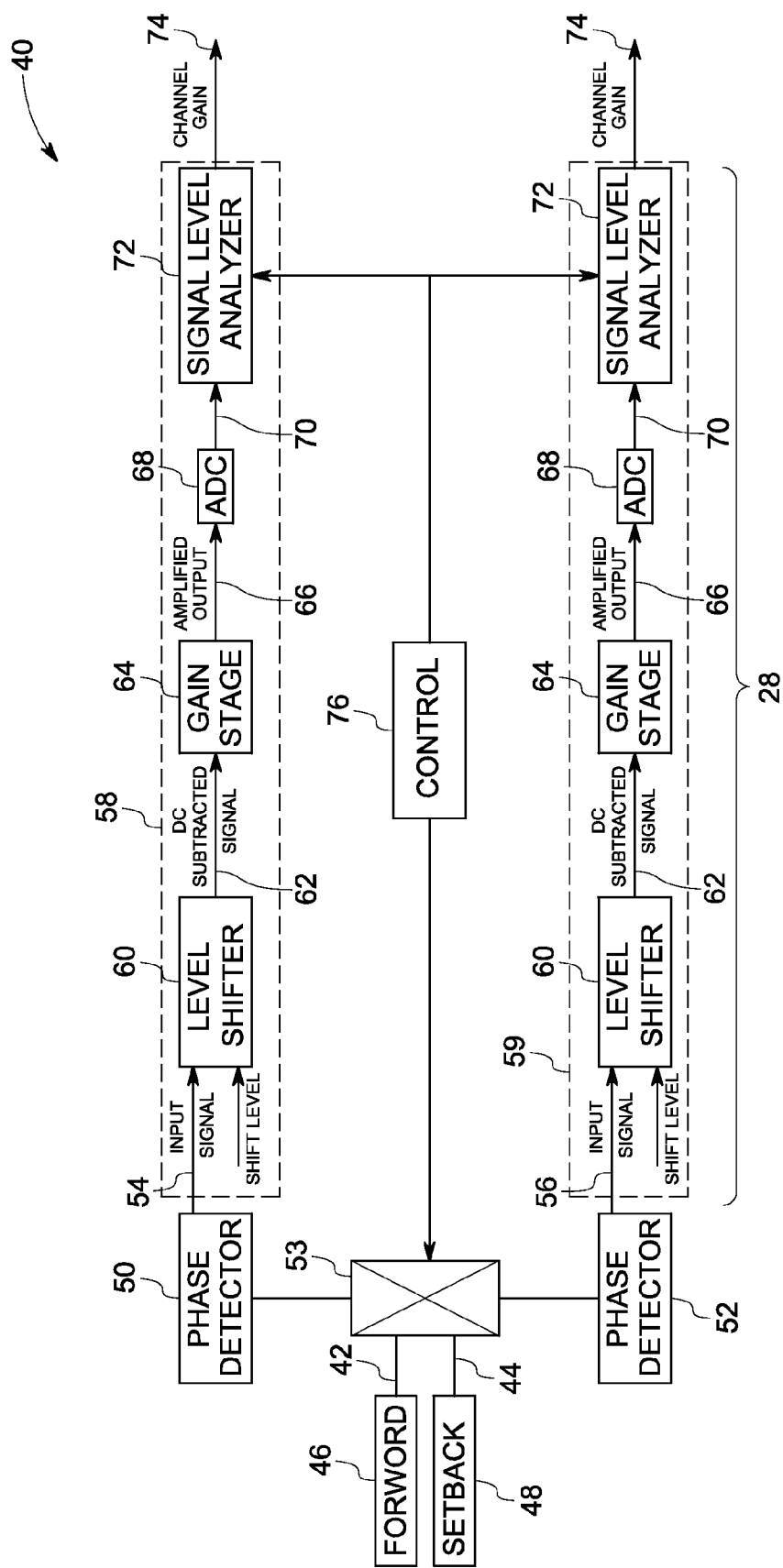
FIG. 2 is a schematic illustration of the calibration module in FIG. 1.

FIG. 2 is a schematic representation of an exemplary online relative phase calibration system 40 including the calibration module 28 in FIG. 1. Signal 42 output from a forward channel 46 that represents measurements obtained from a first sensor or load (FIG. 1) and signal 44 output from a setback channel 48 that represents measurements obtained from a second sensor or load (FIG. 1), are transmitted to a first phase detector 50 and a second phase detector 52. In the illustrated example, a switch 53 coupled to the forward channel 46 and the setback channel 48 switches the signals 42 and 44 at a pre-determined switching interval or in response to a calibration request signal. In one embodiment, the switch 53 is a radio frequency switch transmitting multiple radio frequency signals in a desired range. Signals 54 and 56 output from the first phase detector 50 and the second phase detector 52 respectively are passed through the calibration module 28. For the illustrated example, the calibration module 28 includes at least two calibration circuits 58, 59 coupled to respective phase detectors 50, 52 that calibrate the phase detectors 50, 52, so as to obtain the same value of output voltage under calibration conditions. It will be appreciated that although two calibration circuits have been illustrated herein, the calibration module 28 may include other numbers of calibration circuits. For the illustrated example, each of the calibration circuits 58 includes a level shifter 60 that subtracts a DC component from the signals 54 and 56 respectively to result in a signal 62. An amplifier 64 amplifies the signal 62 to output a signal 66 that is further input into an analog-to-digital converter 68 that converts the signal 66 to a digital calibrated signal 70. The analog-to-digital converter 68 outputs the calibrated voltage 70 into a signal level analyzer 72. A voltage signal 74 output from the signal level analyzer 72 is further sent to a control 76 coupled to the switch 53. The control 76 controls the switching of the signals 42 and 44 between the first phase detectors 50 and the second phase detector 52 based upon the voltage signal 74. In case of a discrepancy in the voltage signal 74 obtained from one of the two calibration circuits 58, 59, the gain is adjusted to match the respective voltage signals 74. In a particular embodiment, the gain is adjusted via a digital multiplier.

Figure 3:
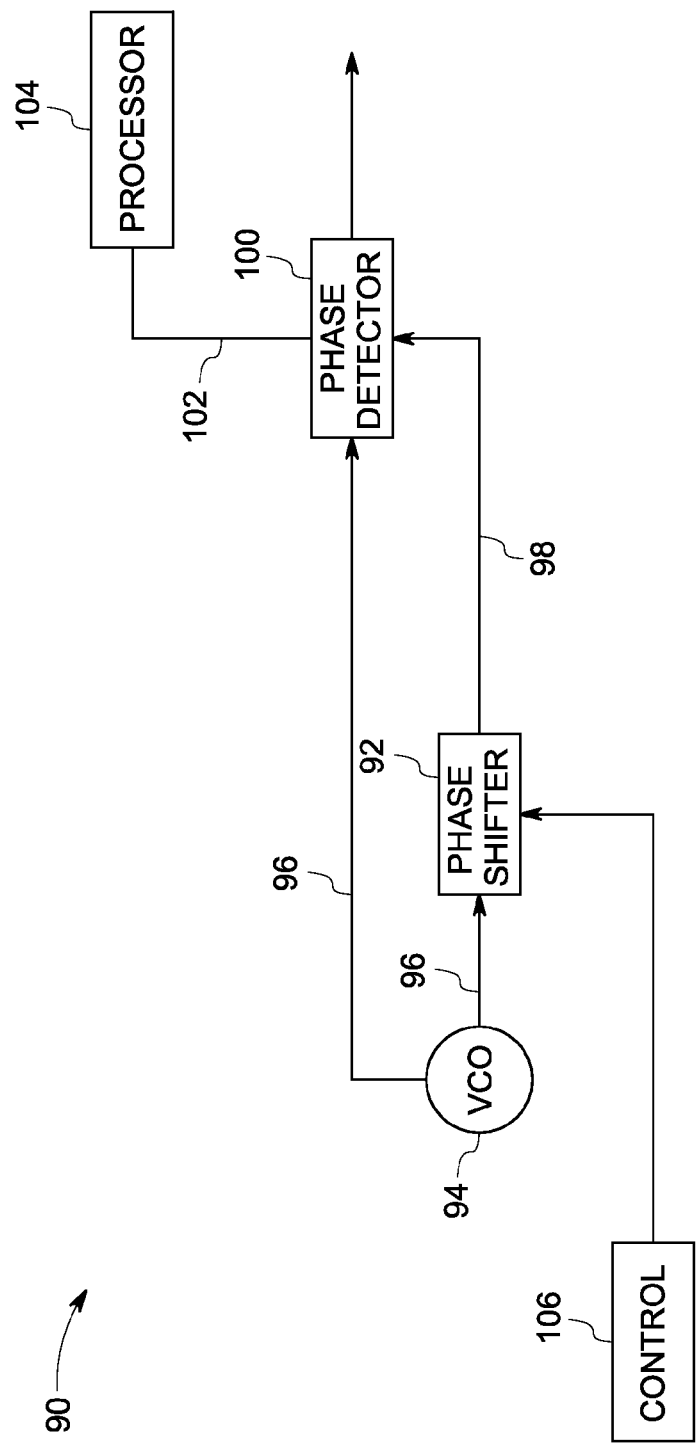
FIG. 3 is a schematic illustration of an online absolute phase calibration system in accordance with embodiments of the invention.

FIG. 3 is a schematic representation of an online absolute phase calibration system 90 including a phase shifter 92. The system 90 includes an excitation source 94 that generates multiple excitation signals 96 at multiple frequencies. The excitation source 12 includes, but is not limited to, a voltage controlled oscillator, a non-controlled oscillator, or a radio-frequency (RF) excitation source. In the illustrated embodiment, the excitation source is a voltage controlled oscillator 94 that is controlled in multiple steps of frequency. The signals 96 pass through the phase shifter 92 that introduces different phase shifts into respective signals 96 to generate multiple phase-shifted excitation signals 98. The signals 96 originating from the voltage controlled oscillator and the phase shifted signals 98 are input into a phase detector 100. The phase detector 100 outputs voltages 102 representative of the different phase shifts introduced. A processor 104 is coupled to the phase detector 100 to determine a corresponding phase-to-voltage transfer function for the phase detector 100 based upon the voltages measured and the different phase shifts.

It should be noted that the present invention is not limited to any particular processor for performing the processing tasks of the invention. The term "processor," as that term is used herein, is intended to denote any machine capable of performing the calculations, or computations, necessary to perform the tasks of the invention. The term "processor" is intended to denote any machine that is capable of accepting a structured input and of processing the input in accordance with prescribed rules to produce an output. It should also be noted that the phrase "configured to" as used herein means that the processor is equipped with a combination of hardware and software for performing the tasks of the invention, as will be understood by those skilled in the art.

In a particular embodiment, a controller 106 is coupled to the phase shifter 92 to correct a shift in phase occurring due to a delay introduced by at least one of multiple electronic components, leads and a transmission line in a circuit, enabling the calibration measurement to occur at a predetermined phase difference setpoint. The controller 106 may be a controlled voltage source used to adjust characteristics of the phase shifter 92.

In a particular embodiment, a controller 106 is coupled to the phase shifter 92 to induce a change in the shift in phase. This enables a variable phase shift to be applied, and the resulting phase output to be measured as a function of phase difference, and a phase to voltage transfer function is computed. The controller 106 may be a variable voltage source such as a square wave source where the levels of the square waves are result in different phase shifts in the phase shifter 92.

Figure 4:
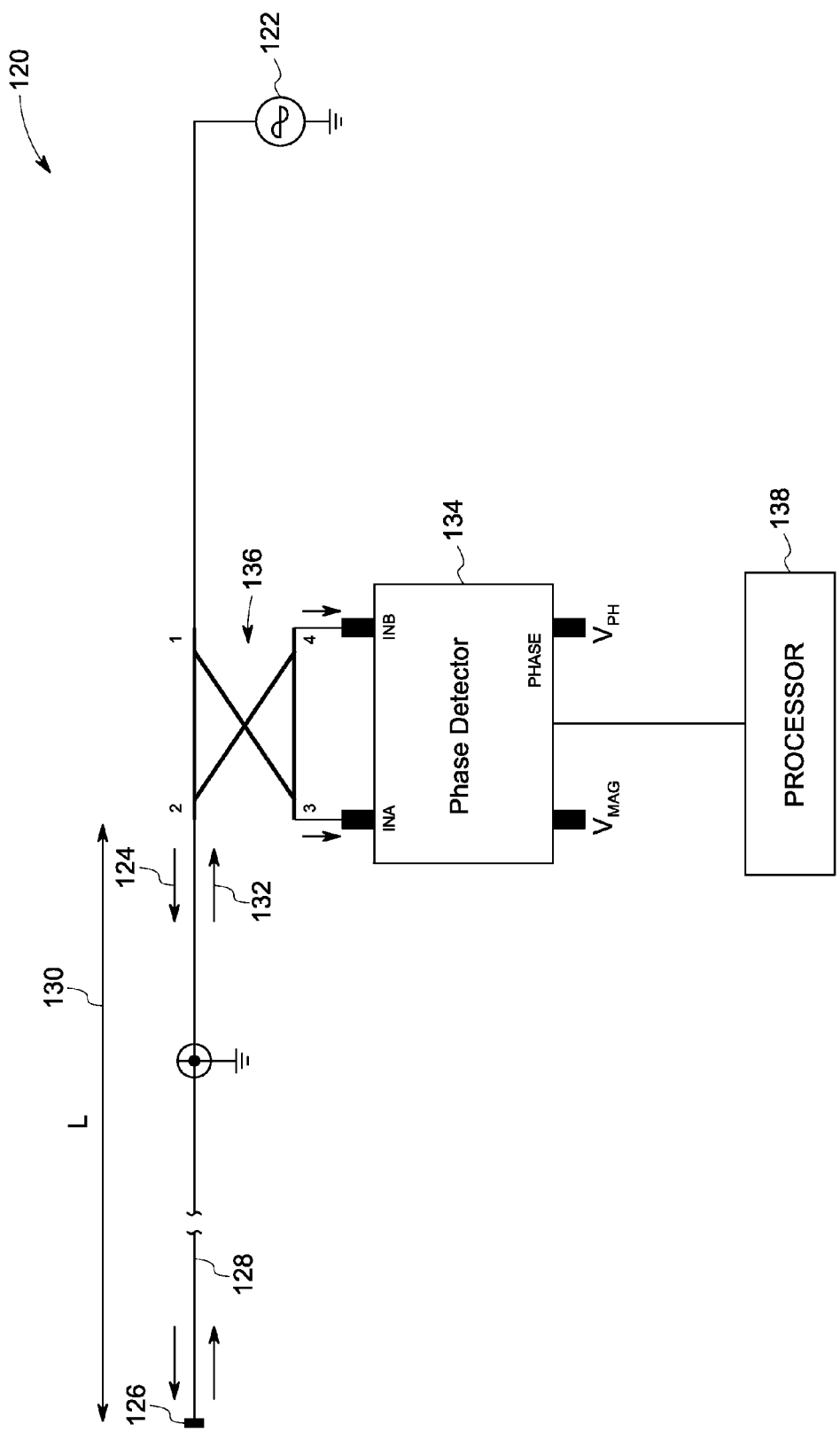
FIG. 4 is a schematic illustration of another exemplary system for online absolute phase calibration in accordance with embodiments of the invention.

FIG. 4 is a schematic illustration of another exemplary system 120 for online absolute phase calibration. The system 120 includes an excitation source, such as, but not limited to, a voltage controlled oscillator 122, as illustrated herein, that generates multiple excitation signals 124 at respective frequencies. The excitation signals 124 are incident upon a load 126 via a transmission line 128 of a length represented by reference numeral 130. In a particular embodiment, the load 126 is a sensor such as a capacitive probe. The excitation signals 124 may also be referred to as incident signals 124. The load 126 reflects a portion of the excitation signal 124 due to an impedance mismatch between an impedance of the load 126 and a characteristic impedance of the transmission line 128. Consequently, this results in generation of reflected signals 132. A phase detector 134 receives the reflected signals 132 after passing through a bidirectional coupler 136. The bidirectional coupler 136 enables independent sampling of the incident signals 138 and the reflected signals 132. The phase detector 134 receives the incident signals 124 and the reflected signals 132 to output voltages representative of a phase difference between the reflected signals 132 and the incident signals 124. A processor 138 is coupled to the phase detector 134 to calculate mathematically the phase difference based upon each of the frequencies and a length of the transmission line 128. A phase-to-voltage transfer function is further determined for the phase detector 134 based upon the phase difference calculated and the voltage measured. This phase to voltage transfer function represents a gain of the phase detector 134 as a function of various phase differences, and is therefore capable of not just correcting for overall gain of the phase-to-voltage process, but also any non-linearity of a response. A digital signal level based multiplier may be used to apply the correction.

Figure 5:
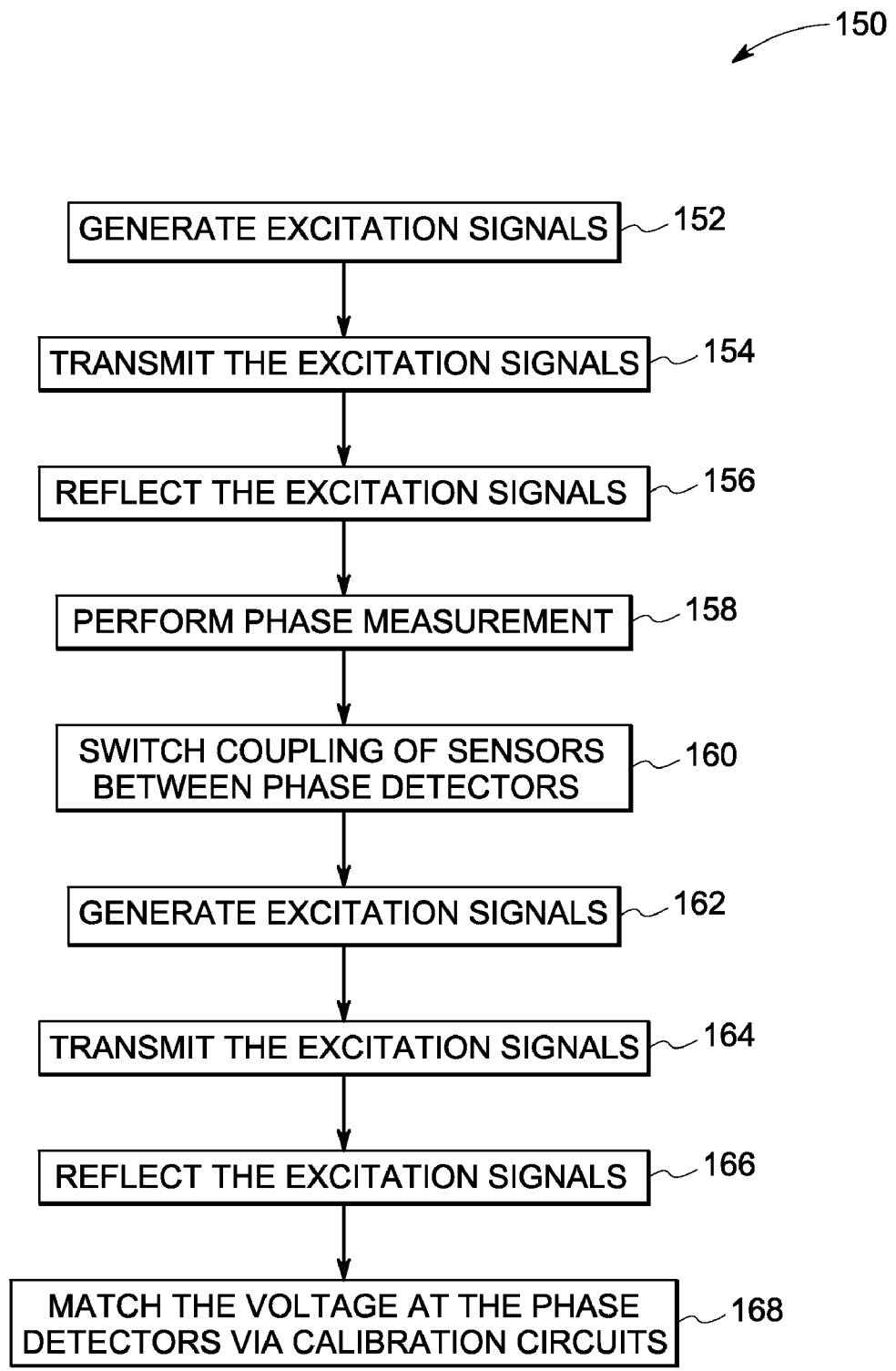
FIG. 5 is a flow chart representing steps in an exemplary method for online relative phase calibration in accordance with embodiments of the invention.

FIG. 5 is a flow chart representing steps in an exemplary method 150 for online relative phase calibration. The method 150 includes generating multiple excitation signals in step 152. In a particular embodiment, the excitation signals are radio frequency excitation signals. Respective excitation signals are transmitted to at least two sensors in step 154. Further, the respective excitation signals are reflected from the sensors in step 156. Multiple phase measurements are performed by generating multiple voltages via at least two phase detectors, wherein each of the voltages represent a phase difference between the excitation signals reflected and the excitation signals transmitted in step 158. A coupling of each of the sensors is switched between the phase detectors at a pre-determined switching interval in step 160. The steps 154, 156, and 158 are repeated successively to form steps 162, 164, and 166 respectively. The voltages obtained in steps 158 and 166 are matched for each of the sensors at the phase detectors to calibrate the phase detectors in step 168. In one embodiment, a gain for each of the phase detectors is adjusted to match the voltages. In another embodiment, the switching is performed at one or more radio frequencies.

Figure 6:
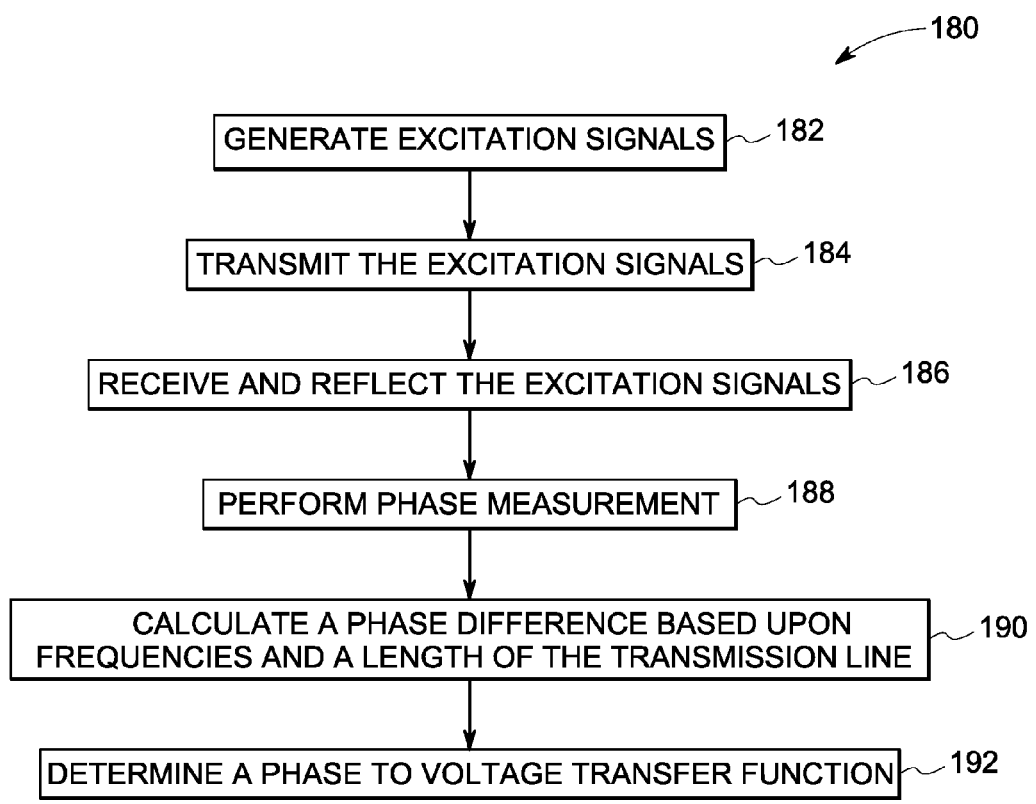
FIG. 6 is a flow chart representing steps in an exemplary method for online absolute phase calibration in accordance with embodiments of the invention.

FIG. 6 is a flow chart representing steps in an exemplary method 180 for online absolute phase correction. The method 180 includes generating multiple excitation signals at respective frequencies in step 182. In a particular embodiment, the excitation signals are radio frequency excitation signals. In the illustrated embodiment, the excitation signals are transmitted via a transmission line in step 184. Further, the excitation signals are received and reflected via a sensor in step 186. Multiple phase measurements are performed in step 188 to generate multiple voltages via a phase detector, wherein each of the voltages represent a phase difference between the excitation signals reflected and the excitations signals transmitted at a respective one of the frequencies. The phase difference measured by the phase detector is a combination of the phase difference induced by time delay of the signal propagation in the transmission line, and reflection coefficient due to the termination impedance seen at the end of the transmission line. By selecting times when the termination impedance is not changing, the phase difference produced due to other factors such as, but not limited to, cable length and frequency can be isolated. A theoretical phase difference is calculated in step 190 based upon the frequencies and a length of the transmission line. A phase-to-voltage transfer function is determined in step 192 for the phase detector based upon the phase difference calculated and the voltages generated at the phase detector. The phase to voltage transfer function represents a gain of the phase detector as a function of various phase differences, and is therefore capable of not just correcting for overall gain of the phase-to-voltage process, but also any non-linearity of a response.

The various embodiments of systems and methods for online phase calibration described above thus provide a way to accurately calibrate electronics during operation. These techniques and systems also allow for online phase calibration without utilizing an absolute phase reference. In addition, the present techniques provide accurate output independent of drifts due to component aging, temperature, and other environmental effects.

Of course, it is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

Furthermore, the skilled artisan will recognize the interchangeability of various features from different embodiments. For example, the use of an example of a radio frequency switch described with respect to one embodiment can be adapted for use with a calibration module including four calibration circuits described with respect to another. Similarly, the various features described, as well as other known equivalents for each feature, can be mixed and matched by one of ordinary skill in this art to construct additional systems and techniques in accordance with principles of this disclosure.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for online absolute phase calibration comprising:
   an excitation source configured to generate a plurality of excitation signals at respective frequencies;
   a sensor coupled to the excitation source via a transmission line, the sensor configured to receive the excitation signals;
   a phase detector coupled to the sensor and configured to:
   receive a plurality of reflected signals from the sensor corresponding to respective ones of the excitation signals; and
   output a voltage representing a phase difference between respective ones of the reflected signals and of the excitation signals; and
   a processor configured to:
   calculate the phase difference based upon each of the frequencies and a length of the transmission line; and
   determine a phase to voltage transfer function for the phase detector based upon the phase difference calculated and the voltage output.

2. The system of claim 1, wherein the frequencies correspond to integer multiples of wavelength within a length of the transmission line resulting in a repeated value of the phase difference.

3. The system of claim 1, wherein the sensor comprises a capacitive probe.

4. The system of claim 1, wherein the excitation source comprises a voltage controlled oscillator.

5. A method for online absolute phase calibration comprising:
   generating a plurality of excitation signals at respective frequencies;
   transmitting the excitation signals via a transmission line;
   receiving and reflecting the excitation signals via a sensor;
   performing a plurality of phase measurements to generate a plurality of voltages via a phase detector, each of the voltages representing a phase difference between the excitation signal reflected and the excitation signal transmitted at a respective one of the frequencies;
   using a processor to calculate a phase difference based upon the frequencies and a length of the transmission line; and
   using a processor to determine a phase to voltage transfer function for the phase detector based upon the calculated phase difference and the voltage output.

6. The method of claim 5, wherein the excitation signals comprise radio frequency excitation signals.

* * * * *